United States Patent [19]

Schlosser

[11] Patent Number: 5,350,453

[45] Date of Patent: Sep. 27, 1994

[54] DEVICE FOR PRODUCING THIN FILMS OF MIXED METAL OXIDES FROM ORGANIC METAL COMPOUNDS ON A SUBSTRATE

[75] Inventor: Ernst-Günther Schlosser, Kelkheim/Taunus, Fed. Rep. of Germany

[73] Assignee: Hoechst Aktiengesellschaft, Frankfurt am Main

[21] Appl. No.: 920,458

[22] PCT Filed: Feb. 21, 1991

[86] PCT No.: PCT/EP91/00325

§ 371 Date: Oct. 13, 1992

§ 102(e) Date: Oct. 13, 1992

[87] PCT Pub. No.: WO91/13185

PCT Pub. Date: Sep. 5, 1991

[30] Foreign Application Priority Data

Mar. 2, 1990 [DE] Fed. Rep. of Germany ....... 4006489

[51] Int. Cl.5 ............... C23C 16/00; C23C 16/40; C23C 16/44
[52] U.S. Cl. .................... 118/719; 505/730; 505/732; 505/734; 505/950; 505/447; 118/715; 118/725; 118/726
[58] Field of Search ............... 118/715, 719, 725, 726, 118/724; 505/730, 732, 734

[56] References Cited

U.S. PATENT DOCUMENTS

| 2,793,609 | 5/1957 | Shen | 118/726 |
|---|---|---|---|
| 3,211,128 | 10/1965 | Potter | 118/725 |
| 3,446,936 | 5/1969 | Hanson | 118/726 |
| 3,603,285 | 9/1971 | Nicol | 118/725 |
| 4,217,855 | 8/1980 | Takagi | 118/726 |
| 4,286,545 | 9/1981 | Takagi | 118/726 |
| 4,854,264 | 8/1989 | Noma | 118/719 |
| 5,183,510 | 2/1993 | Kimura | 118/719 |
| 5,185,317 | 2/1993 | Wessels | 427/62 |

FOREIGN PATENT DOCUMENTS 3827069 6/1989 Fed. Rep. of Germany .
62-206824 9/1987 Japan ................... 118/726

OTHER PUBLICATIONS

Gurvitch, Mat. Res. Soc. Symp. Proc. vol. 99, 1988, Materials, Research Society.
Terasaki, Jap. J. Appl. Phys. vol. 27, No. 8, Aug. 1988 pp. L1480–L1483.
Extended Abstracts of 1989 International Superconductivity Electronics Conference (ISEC '89), pp. 425–428.

Primary Examiner—Richard Bueker
Attorney, Agent, or Firm—Curtis, Morris & Safford

[57] ABSTRACT

In the device for producing thin films of metal oxides from organic metal compounds on a substrate, there is a truncated pyramidal hollow body (3) in an evacuable housing (1). Disposed concentrically with respect to the axis of symmetry (16) of the hollow body (3) in its base (7) are at least three furnaces (8) which have reception devices (9) for the metal compounds (10) to be evaporated. The reception devices (9) are provided with guide pipes (11) which project into the hollow interior of the hollow body (3) and are inclined towards its axis of symmetry (16). The casing (12) of the truncated pyramid merges into a pipe (13) above whose end there is disposed a heatable reception device (5) for the substrate (4). A gas feed pipe (6) terminates in the hollow interior [sic] of the hollow body (3) between the guide pipes (11) and the end of the pipe (13).

15 Claims, 1 Drawing Sheet

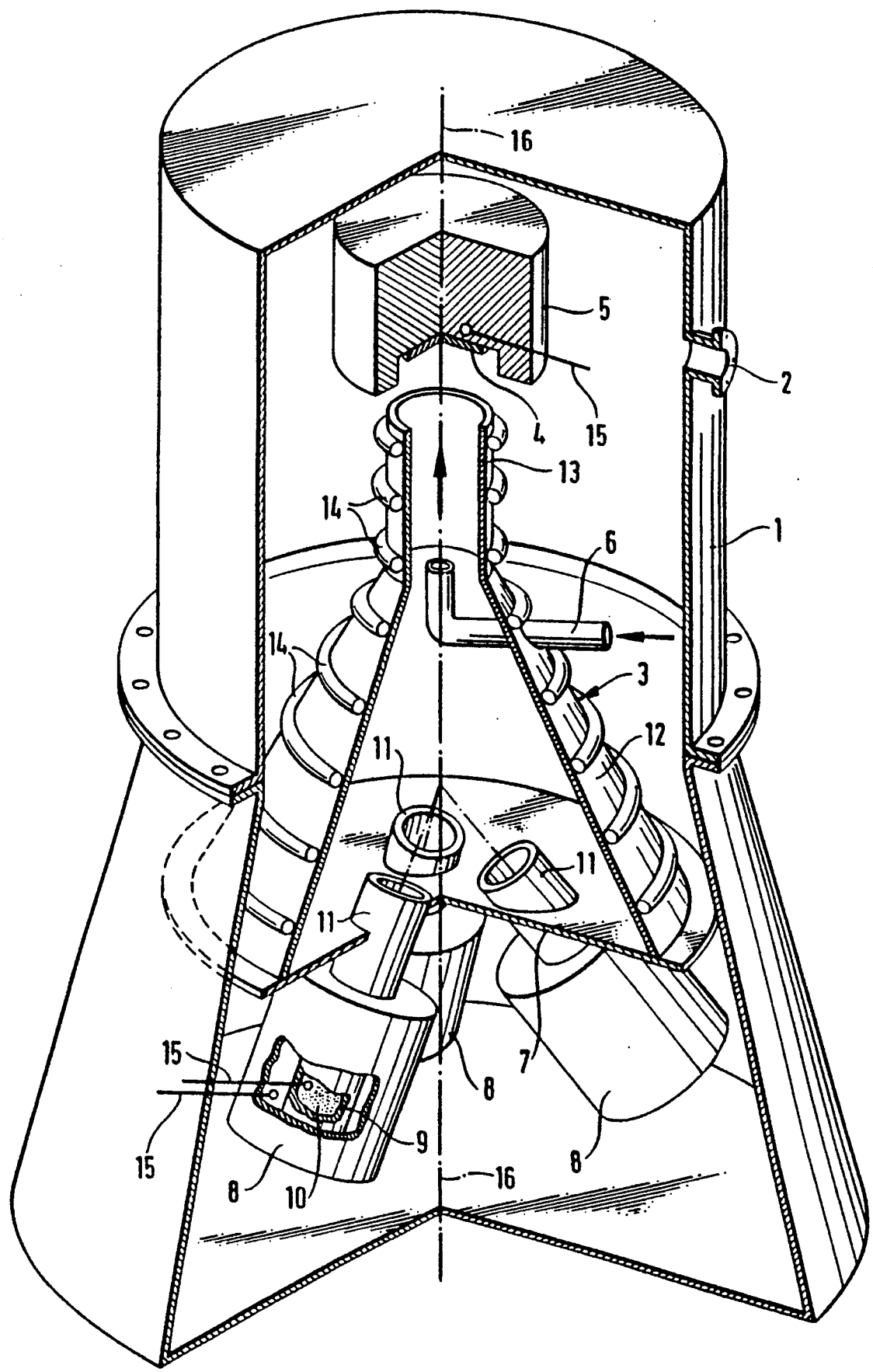

DEVICE FOR PRODUCING THIN FILMS OF MIXED METAL OXIDES FROM ORGANIC METAL COMPOUNDS ON A SUBSTRATE

DESCRIPTION

The invention relates to a device for producing thin films of mixed metal oxides from organic metal compounds on a substrate.

Because of their high critical temperature, the modern high-temperature superconductors (HTSCs) consisting of mixtures of three and more metal oxides have aroused considerable interest. The HTSCs which are disposed as thin films on support substances (substrates) over a relatively large area have acquired particular significance. Such films can be deposited on suitable substrates by vacuum evaporation, by means of sputtering processes, laser ablation, spin or spray coating, or the so-called chemical vapor deposition (CVD) process. HTSC films of high quality can be produced, in particular, by the CVD process. If narrow substrates, such as wires and filaments, are used, a side and back coating also takes place.

To carry out the chemical vapor deposition process, an evacuable device which comprises three evaporators which are in communication with a heatable reception device for the substrate via a manifold has been disclosed at the International Superconductivity Electronics Conference (ISEC '89) held on Jun. 12 and 13, 1989 in Tokyo [Extended Abstracts of 1989 International Superconductivity Electronics Conference (ISEC '89), pages 425–428]. The organic metal compounds, such as, for example, $\beta$-diketone metal chelates of yttrium, barium and copper, are each heated with different intensities in the evaporators, the resultant vapor of these metal compounds is combined with an oxygen stream using argon as carrier gas and pyrolyzed or oxidized at approximately 850° C., and the resultant mixed metal oxides are deposited on the substrate. A disadvantage of this device is the expenditure on control technology for the conveyor gas streams and the heating devices which are necessary for the pipelines between the evaporators and the reception device in order to prevent the condensation of the metal compounds there or to initiate a pyrolysis process prematurely. As a consequence of the dilution resulting from the conveyor gas, the material consumption is high for a deposition rate of not more than 17 nm per minute. In addition, an appreciable portion of the metal compounds decomposes prematurely owing to the long conveyor paths.

It is here that the invention seeks to provide a remedy. The object is achieved by a device in which there is, in an evacuable housing, a truncated pyramidal hollow body 1. in which there are disposed, concentrically with its axis of symmetry,
   a) at least three furnaces in the base of the hollow body which have reception devices for the metal compounds to be evaporated, which reception devices are provided with guide pipes which project into the hollow interior of the hollow body and are inclined towards the axis of symmetry,
   b) a pipe into which the casing of the truncated pyramid merges and above whose end there is disposed a heatable reception device for the substrate, and 2. in whose hollow interior a gas feed pipe terminates between the guide pipes and the end of the pipe.

In addition, the furnaces may be symmetrically disposed around the axis of symmetry of the hollow body. A shutter may be disposed between the hollow body and the heatable reception device for the substrate. As gas feed pipe, a plurality of nozzles or a nozzle ring may also be used instead of a single nozzle. The hollow body and the pipe may be provided with a temperature-control device, i.e. for heating and/or cooling. For the purpose of thermal decoupling, baffle plates may be disposed between the guide pipes.

The advantages achieved by the invention are essentially to be seen in the omission of the conveyor gas and the simple compact construction of the device associated therewith. Furthermore, the material losses which occur in the known device owing to the severe dilution of the vapors with the carrier gas do not apply. Premature pyrolysis of the metal compounds is avoided by the omission of long lines. Deposition rates of 130 nm per minute and over are achieved.

The invention is explained in greater detail below by reference to only one drawing depicting a method of embodiment.

BRIEF DESCRIPTION OF THE DRAWING

The FIGURE shows the device in perspective and in partial section.

Disposed in a housing 1 which can be evacuated via connecting piece 2 is a truncated pyramidal hollow body 3. Suitable truncated pyramidal hollow bodies are 3-sided to n-sided hollow bodies, including truncated conical hollow bodies. Disposed concentrically with the axis of symmetry 16 of the hollow body 3 in the base 7 are at least three furnaces 8. To produce an HTSC mixed oxides containing more than three metals the number of furnaces 8 has to be increased accordingly.

Disposed in the furnaces 8 are reception devices 9 for the organic metal compounds 10 to be evaporated. Said reception devices 9 are provided with guide pipes 11 which project through the base 7 into the hollow interior of the hollow body 3 and are inclined towards the axis symmetry 16. As a result of the inclination of the guide pipes 11 towards the axis of symmetry, the vapor clouds of the organic metal compounds emerging from the guide pipes 11 overlap and are thoroughly mixed. The focussing and thorough mixing of the vapor clouds is assisted by the conical shape of the hollow body casing 12. The casing 12 merges into a pipe 13 which is also disposed concentrically with the axis of symmetry 16 and above whose end there is a heatable reception device 5 for the substrate 4. Opening into the hollow interior of the hollow body 3 between the guide pipes 11 and the pipe 13 is a gas feed pipe 6 for the oxygen needed for the oxidation. To protect the substrate during the start-up phase, a shutter (not shown) may be disposed between pipe 13 and substrate 4. Baffle plates (not shown) may be disposed between the guide pipes 11 if a temperature equalization between the furnaces, which are at different temperatures, has to be avoided. Hollow body 3 and pipe 13 may be provided with a device 14 which serves for heating and/or cooling. Both the furnaces 8 and the reception devices 9 are provided with temperature sensors 15, as is the reception device 5 for the substrate 4.

I claim:

1. Device for producing thin films of mixed metal oxides from organic metal compounds on a substrate, characterized in that there is, in an evacuable housing (1), a truncated frustum shaped hollow body (3) formed from a casting (12), having a base (7) and an axis of symmetry (16), in which there are disposed, on a circumference of a circle that is concentric with the axis of symmetry (16), a) at least three furnaces (8) in the base (7) of the hollow body which have reception devices (9) for the metal compounds (10) to be evaporated, which reception devices (9) are provided with guide pipes (11) which project into the hollow interior of the hollow body (3) and are inclined towards the axis of symmetry (16), b) a confluence pipe (13), into which the truncated frustum hollow body merges, having a first and second end, and above whose second end there is disposed a heatable reception device (5) for the substrate (4), and in the interior of the frustum shaped hollow body, a gas feed pipe terminates between the guide pipe (11) and the first end of the confluence pipe (13).

2. Device according to claim 1, characterized in that the furnaces (8) are disposed symmetrically on a circumference of a circle that is concentric with respect to the axis of symmetry (16) of the hollow body (3).

3. Device according to one of claims 1 or 2, characterized in that a shutter is disposed between the hollow body (3) and the heated reception device (5) for the substrate (4).

4. Device according to claim 1, characterized in that the gas feed pipe (6) comprises a nozzle ring.

5. Device according to claim 1, characterized in that the hollow body (3) and the pipe (13) are provided with a temperature-control device (14).

6. Device according to one of claim 1 to 5, characterized in that baffle plates are disposed between the guide pipes (11).

7. Device according to claim 2, characterized in that the gas feed pipe (6) comprises a nozzle ring.

8. Device according to claim 2, characterized in that the hollow body (3) and the confluence pipe (13) are provided with a temperature-control device (14).

9. Device according to claim 2, characterized in that baffle plates are disposed between the guide pipes (11).

10. Device according to claim 3, characterized in that the gas feed pipe (6) comprises a nozzle ring.

11. Device according to claim 3, characterized in that the hollow body (3) and the confluence pipe (13) are provided with a temperature-control device (14).

12. Device according to claim 3, characterized in that baffle plates are disposed between the guide pipes (11).

13. Device according to claim 4, characterized in that the hollow body (3) and the confluence pipe (13) are provided with a temperature-control device (14).

14. Device according to claim 4, characterized in that baffle plates are disposed between the guide pipes (11).

15. Device according to claim 5, characterized in that baffle plates are disposed between the guide pipes (11).

* * * * *